United States Patent
Rylov et al.

(10) Patent No.: US 6,903,579 B2
(45) Date of Patent: Jun. 7, 2005

(54) PIPELINED LOW-VOLTAGE CURRENT-MODE LOGIC WITH A SWITCHING STACK HEIGHT OF ONE

(75) Inventors: Sergey V. Rylov, White Plains, NY (US); Alexander V. Rylyakov, Mount Kisco, NY (US)

(73) Assignee: International Business Machines Corporation, Armonk, NY (US)

(*) Notice: Subject to any disclaimer, the term of this patent is extended or adjusted under 35 U.S.C. 154(b) by 31 days.

(21) Appl. No.: 10/607,468

(22) Filed: Jun. 26, 2003

(65) Prior Publication Data

US 2004/0263210 A1 Dec. 30, 2004

(51) Int. Cl.[7] .............................................. H03K 19/20
(52) U.S. Cl. ........................ 326/115; 326/127; 327/408
(58) Field of Search ................................ 326/127, 115; 327/407, 408, 411

(56) References Cited

U.S. PATENT DOCUMENTS 6,680,625 B1 * 1/2004 Lee et al. .................... 326/115
6,781,420 B2 * 8/2004 Zhang ........................ 326/115

OTHER PUBLICATIONS

B. Razavi, Y. OTa, and R. G. G. Swart, Design Techniques for low–voltage high–speed digital bipolar circuits, IEEE J. Solid–State circuits, IEEE J. Solid–State Circuits, vol. 29, No. 3, Mar. 1994, pp. 332–339.
Campbell, Peter M. et al., "A Very–Wide Bandwidth Digital VCO Implemented, in GaAs HBTs Using Frequency Multiplication and Division," 17th Annual GaAs IC Symposium Technical Digest, pp. 311–314, Oct. 1995.

* cited by examiner

Primary Examiner—Daniel Chang
(74) Attorney, Agent, or Firm—Scully, Scott, Murphy & Presser; Satheesh K. Karra, Esq.

(57) ABSTRACT

Multiple-input CML gates with a stack height of one are provided by using a composite device wherein input signals are propagated to the output through two or more stages of CML-like primitives connected in succession. A universal three-input CML gate (a 2:1 multiplexor) is provided by using a two-stage pipeline, and can be used to build other logic devices, such as AND, OR, and XOR functions, or a latch. The pipelined CML gates with a stack height of one provide a substantially improved voltage-speed trade-off under low-voltage conditions.

11 Claims, 2 Drawing Sheets

PIPELINED LOW-VOLTAGE CURRENT-MODE LOGIC WITH A SWITCHING STACK HEIGHT OF ONE

BACKGROUND OF THE INVENTION

1. Field of the Invention

The present invention relates generally to digital logic circuits, and more specifically, pertains to pipelined designs in digital logic circuits. Multiple-input current-mode logic (CML) gates with a stack height of one are provided by using a composite device wherein input signals are propagated to the output through two or more stages of CML-like primitives connected in succession. A universal three-input CML gate (a 2:1 multiplexor) is provided by using a two-stage pipeline, and can be used to build other logic devices, such as AND, OR, and XOR functions, or a latch. The pipelined CML gates with a stack height of one provide a substantially improved voltage-speed trade-off under low-voltage conditions.

2. Discussion of the Prior Art

Current-mode logic (CML) circuits are commonly used in applications where maximum speed of operation is desired. CML circuits use differential low-voltage signaling and have constant power consumption. A CML gate consists of a dc current source, a differential load and a switching network, composed of either MOSFETs or bipolar transistors, which connect the current source to the differential load. An important parameter of the switching network is its stack height, which is the number of switching devices connected in series between the current source and the load FIG. 1 illustrates a simple prior art CML buffer gate using a conventional topology.

FIG. 2 illustrates a prior art CML 2:1 multiplexor switching network. In a conventional topology, the switching network routes the tail current from the current source IT to only one of the two load devices R1, R2, and this results in gates with multiple logic inputs having stacked switching devices.

It is becoming increasingly difficult to implement multiple-transistor stacks in newer process generations of circuits, particularly in bipolar technologies, because the supply voltage is being steadily scaled downwardly. The voltage headroom consumed by each stack level either scales much slower than the supply voltage ($V_t$ in CMOS devices), or stays virtually unchanged ($V_{be}$ in bipolar devices). In order to implement fast CML circuits at progressively lower supply voltages, it is desirable to reduce the switching stack of multiple-input CML gates to just one transistor.

One possible way to implement CML gates with a single-transistor stack was suggested by Razavi et al. [B. Razavi, Y. Ota, and R. G. Swartz, Design techniques for low-voltage high-speed digital bipolar circuits, IEEE J. Solid-State Circuits, vol. 29, no. 3, March 1994, pp. 332–339] who proposed several ways to "fold" the two-transistor stack of conventional CML gates. These solutions however use different signal levels for different gate inputs, or alternatively use a dc voltage reference input. This requires additional level shifters and reference voltage generators.

A different technique for achieving the same goal was proposed by Campbell et al. [Campbell, Peter M. et al., "A Very-Wide Bandwidth Digital VCO Implemented in GaAs HBTs Using Frequency Multiplication and Division," 17th Annual GaAs IC Symposium Technical Digest, pp. 311–314, October 1995], who describe an XOR gate built from two cascaded CML-like primitives, each having a single-transistor stack. In contrast to the "folded" CML gates, this approach uses conventional CML signal levels for all inputs and outputs, but the described XOR gate is not a universal logic gate which can be used to build any arbitrary logic function.

In order to describe how the present invention solves the problem of reducing the minimum stack height of CML logic gates, consider the structure of a conventional CML gate. FIG. 1 illustrates a simple prior art CML buffer gate which has one differential input (AP (or A), AN) and one differential output (ZP (or Z), ZN), which simply repeats the input signal. Note that the suffix N (negative) is to show a logical inversion of a signal designated with a P (positive) suffix (e.g. AP) or with no suffix (e.g. A). The same circuit can also function as an inverter if one swaps its outputs (Z'=ZN, ZN'=Z). The CML buffer consists of a tail current source IT, two symmetric switches controlled by differential input signals (AP, AN), and a differential load consisting of two symmetric load devices RL, shown as R1, R2. The switches and the current source can be made from either FETs or bipolar transistors. Nominally only one of the two switches is on, while the other switch is off, so that the tail current flows completely through one of the two loads RL and creates a voltage drop of IT×RL, while the other load RL has no current and no voltage drop. Consequently the outputs ZP, ZN can have only two values: high, equal to the upper power rail voltage VDD; and low, which is VDD−IT×RL. The stack height of this gate is one.

More complex CML logic gates of conventional structure still use one tail current source IT and one symmetric pair of load devices RL, but have a more complex switching tree, and they still route the entire tail current IT to one of the two loads while keeping the other load at zero current. In order to achieve the latter goal, conventional gates use a series connection of switches, and therefore use a stack height of two or more switching devices.

As an illustration, FIG. 2 shows a typical prior art multiple-input CML gate, which is a 2:1 multiplexor (also known as 2:1 selector). It has three logic inputs A, B, and C and one logic output Z (all differential), with the output being equal to A for C=1 and to B for C=0, i.e. Z=A×C+B×CN, and ZN=AN×C+BN×CN. The stack height of this gate is two.

Conventional multiple-transistor-stack CML gates when operated at a progressively lower supply voltage experience a substantial reduction in speed, since there is a minimum amount of voltage per stack level necessary for fast switching. In some cases (but not always) this reduction in speed may be compensated for by an increase in power consumption. Therefore for high-speed, low-power operation under low-voltage conditions, single-transistor-stack CML gates are desirable.

The single-transistor-stack CML gates with "folded" stacks proposed by Razavi et al. use different signal levels for different gate inputs or, alternatively, use a dc voltage reference input. This requires additional level shifters and reference voltage generators, which increase the design complexity.

The single-transistor-stack XOR gate proposed by Campbell et al. is not universal, so there are logical functions that cannot be implemented with this gate, e.g. an AND function.

SUMMARY OF THE INVENTION

The present invention provides improved circuits for current mode logic (CML) digital logic circuits, particularly such digital logic circuits with a stack height no greater than one switching device, with improved speed for a given power supply voltage, and with a reduced power supply voltage for a given speed.

The present invention provides a "cascading" approach that can be used to build a universal CML gate, a 2:1 multiplexor identical in function to that shown in FIG. 2, but while using a single-transistor stack. This novel multiplexor gate can be used to implement a low-voltage bipolar latch and further a static 1:2 divider built from a pair of such latches.

BRIEF DESCRIPTION OF THE FIGURES

The foregoing objects and advantages of the present invention for pipelined low-voltage current-mode logic with a switching stack height of one may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The present invention reduces the minimum stack height of multiple-input CML gates from two to one by using cascaded (pipelined) CML-like primitives. The present invention shows how to realize a universal three-input CML gate (a 2:1 multiplexor) using a two-stage pipeline, and demonstrates how this gate can be used to build other logic devices, such as AND, OR, and XOR functions, and a latch.

One major advantage of the inventive pipelined CML gates with a stack height of one is a substantially improved voltage-speed trade-off under low-voltage conditions. When compared to conventional CML gates with a stack height of two, they operate faster for a given voltage and tolerate a lower voltage for a given speed.

The present invention provides multiple-input CML gates with a stack height of one by using a composite device wherein input signals are propagated to the output through two or more stages of CML-like primitives connected in succession. CML-like primitives in this context means that at least some of these primitives are not CML gates themselves, particularly that at least some of the internal signals within a composite CML gate are not standard CML logic signals (which are differential, two-valued signals). Specifically, some of the internal signals are not differential signal pairs, and/or some signals have more than two discrete values.

Figure 1:
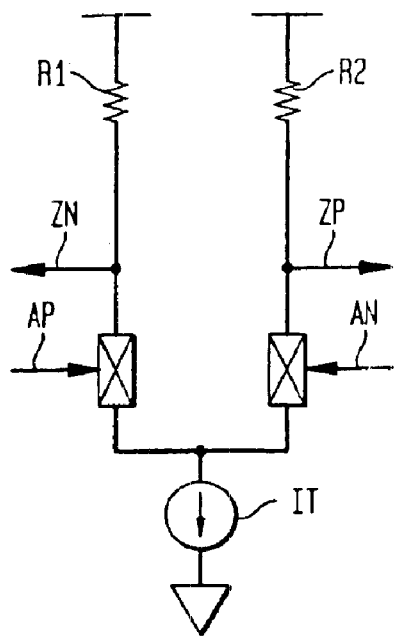
FIG. 1 is a circuit diagram of a simple prior art CML buffer.
Figure 2:
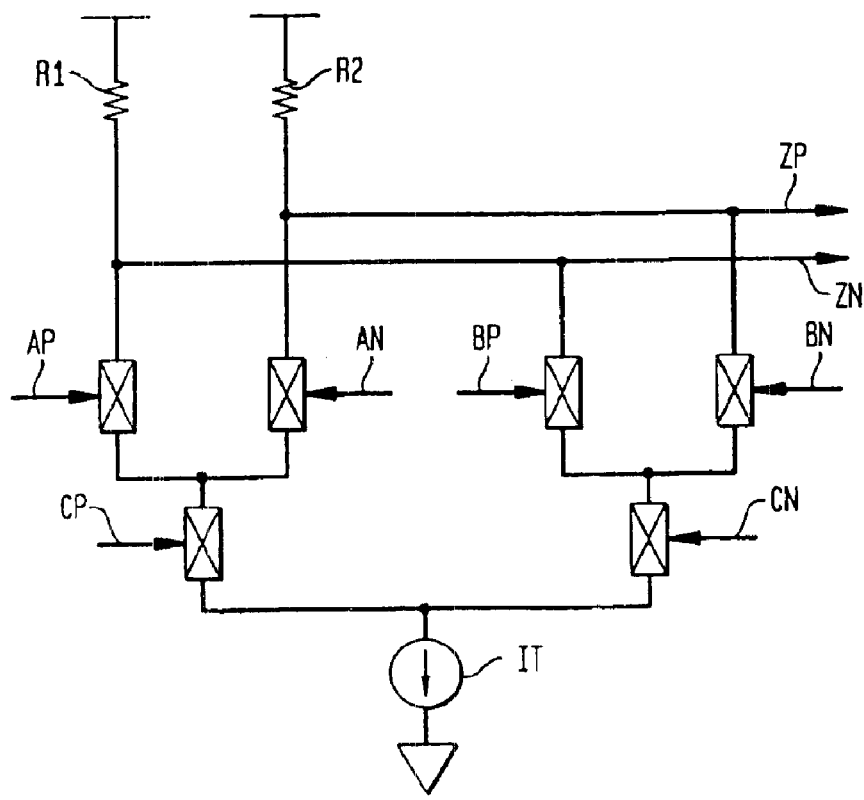
FIG. 2 is a circuit diagram of a prior art 2:1 CML multiplexor.
Figure 3:
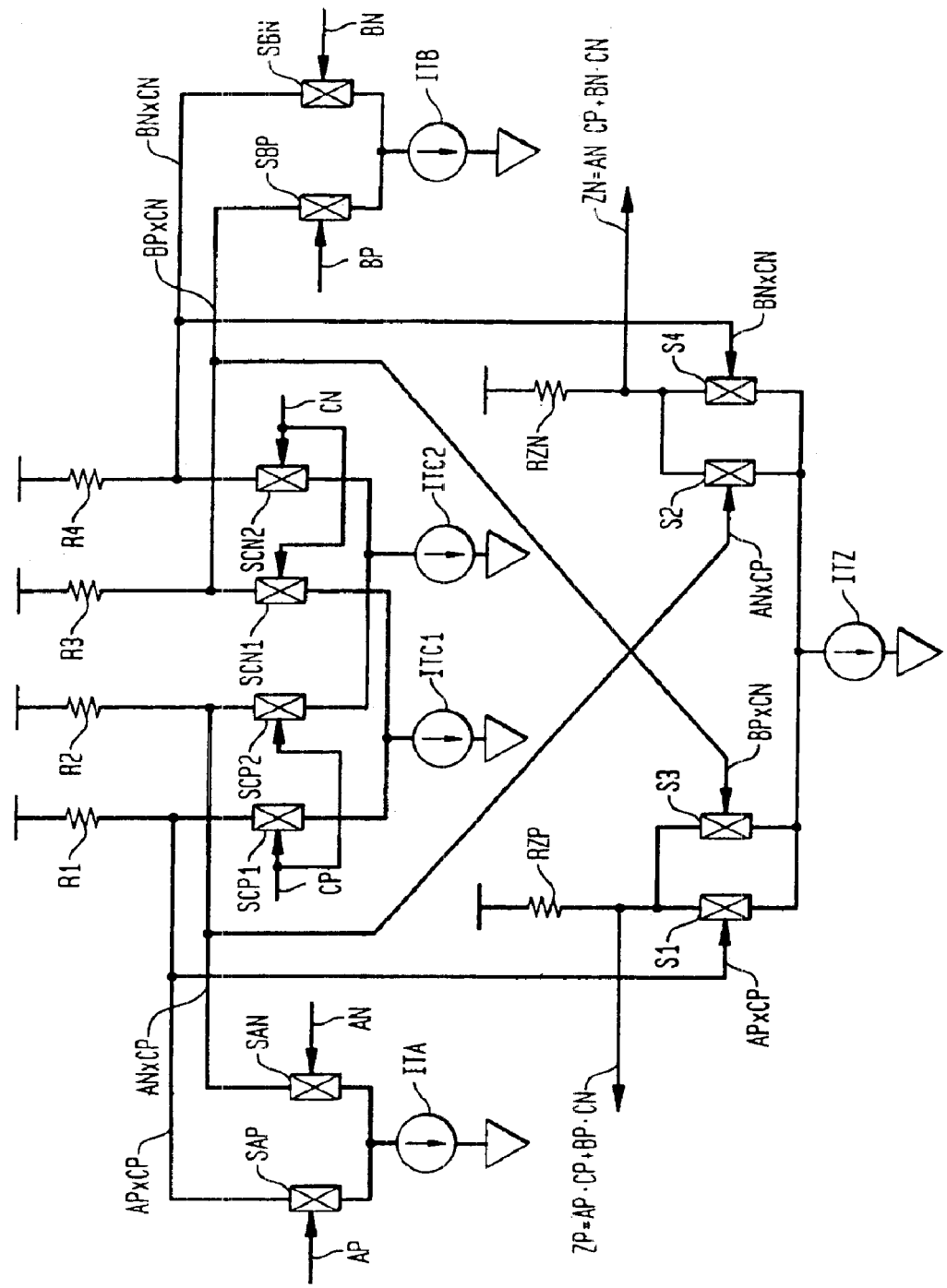
FIG. 3 is a circuit diagram of a preferred embodiment of the present invention.

FIG. 3 illustrates an exemplary embodiment of the present invention for a composite 2:1 multiplexor with a stack height of one which provides the same logic function as the conventional CML gate shown in FIG. 2. The composite CML gate shown in FIG. 3 uses two stages to generate the desired output. The first stage, shown in the top layer of FIG. 3, accepts three logic signals A, B, and C, represented as standard CML differential pairs (AP, AN), (BP, BN), and (CP, CN), and generates a set of four intermediate signals AP×CP, AP×CN, BP×CN, BN×CN. These four intermediate signals are then applied to the second stage, shown in the bottom layer in FIG. 3, where they produce the final CML-compliant outputs ZP=AP×CP+BP×CN, ZN=AN×CP+BN×CN.

The first stage of the composite CML gate, shown at the top of FIG. 3, consists of four identical current sources, ITA, ITB, ITC1, ITC2, four identical load devices R1, R2, R3, R4, and eight identical switches, SAP, SAN, SBP, SBN, SCP1, SCP2, SCN1, SCN2, forming a switching network with a stack height of one. Each load device is connected to two current sources via two independent switches, and therefore can receive zero, one or two units of current. Consequentially, each of the four output signals of the first stage can have three different values, high, intermediate, and low. Within these four signals, one is always high, another one is low, and the remaining two are intermediate values.

The second stage, shown at the bottom of FIG. 3, has only one current source ITZ and two symmetric load devices RZP, RZN, each connected to the current source via two switches in parallel, switch pair S1, S3 and switch pair S2, S4, yielding again a stack height of one. Within each parallel switch pair, one switch always receives an intermediate-level signal, while the other switch receives either a high signal or a low signal. In a properly designed circuit, practically the entire tail current flows through the switch with a high input signal, while the two switches with an intermediate-level signal receive only a small portion of the entire tail current and distribute it evenly between the two load devices, and finally the remaining switch with the low input signal carries zero current. Therefore, the output of the second stage of the composite CML gate provides a proper CML differential signal using two discrete voltage levels (low and high).

A 2:1 multiplexor is a universal logic gate which can be used to build an arbitrary logic function. For example, assigning B=0 provides an AND function (Z=AC), assigning B=1 provides an OR function (Z=A+CN).

assigning B=Z provides a simple latch, which is transparent for C=1 (Z=A) and opaque for C=0 (Z=Z, i.e. Z is latched), assigning B=AN provides an XOR function (Z=A×C+AN×CN).

The XOR function has been already proposed by Campbell, et al. and the resulting hardware configuration in this case essentially coincides with that of Campbell, et al. In that respect, the present invention can be considered to be a generalization of the Campbell, et al. idea. A main advantage of the generalized approach of the present invention is in achieving universal logic functionality, as opposed to the limited XOR function of the Campbell et al. gate. In addition, Campbell, et al. described their device as being made of bipolar transistors, while the CML digital logic circuits of the present invention can be made with either or both of bipolar devices and FETs.

While several embodiments and variations of the present invention for pipelined low-voltage current-mode logic with a switching stack height of one are described in detail herein, it should be apparent that the disclosure and teachings of the present invention will suggest many alternative designs to those skilled in the art.

What is claimed is:

1. A current mode logic circuit, comprising:

a first stage comprising at least one first stage switching element having a first stage controlling input and connected as a stack of one to at least one first stage load resistor to control current from a first stage current source through the at least one first stage load resistor to form a first stage output;

a second stage comprising at least one second stage switching element having the first stage output as a second stage controlling input and connected as a stack of one to at least one second stage resistor to control current from a second stage current source through the at least one second stage load resistor to form a second stage output;

wherein the current mode logic circuit is a universal logic gate which can be used to build any arbitrary logic function.

2. The current mode logic circuit of claim 1, wherein the universal logic gate comprises an inverter function and an AND function.

3. The current mode logic circuit of claim 1, wherein the first stage controlling input includes a set of at least three logic signal pairs, and the first stage generates a first stage output of a set of at least four first stage output signals that are applied to the second stage.

4. The current mode logic circuit of claim 3, wherein the first stage includes at least four identical current sources, at least four identical load devices, and at least eight identical switches forming a switching network with a stack height of one, wherein each load device is connected to two current sources via two different switches, and produces first stage output signals having high, intermediate, or low values.

5. The current mode logic circuit of claim 4, wherein the second stage includes only one single current source, two symmetric load devices, each connected to the current source by two switches in parallel, forming a switching network with a stack height of one, wherein within each parallel switch pair, one switch always receives an intermediate value signal and the other switch receives either a high value signal or a low value signal, and substantially the entire second stage output current flows through the switch with the high value signal, while the two switches with the intermediate value signal receive only a small portion of the entire second stage output current and distribute it evenly between the two load devices, and the remaining switch with the low value signal carries zero current.

6. The current mode logic circuit of claim 1, wherein the first stage includes at least four identical current sources, at least four identical load devices, and at least eight identical switches forming a switching network with a stack height of one, wherein each load device is connected to two current sources via two different switches, and produces first stage output signals having high, intermediate, or low values.

7. The current mode logic circuit of claim 1, wherein the second stage includes only one single current source, two symmetric load devices, each connected to the current source by two switches in parallel, forming a switching network with a stack height of one, wherein within each parallel switch pair, one switch always receives an intermediate value signal and the other switch receives either a high value signal or a low value signal, and substantially the entire second stage output current flows through the switch with the high value signal, while the two switches with the intermediate value signal receive only a small portion of the entire second stage output current and distribute it evenly between the two load devices, and the remaining switch with the low value signal carries zero current.

8. A two to one multiplexer circuit comprising:

an AP input and an AN input that form an A differential input, a BP input and a BN input that form a B differential input, a CP input and a CN input that form a C differential input, and a ZP output and a ZN output that form a Z differential output;

an A differential switch pair having an SAP switch element controlled by the AP input and an SAN switch element controlled by the AN input, and the SAP and SAN switch elements are connected to a common TA current source providing an ITA current, wherein the ITA current flows through the SAP switch element when the AP input is higher than the AN input, and the ITA current flows through the SAN switch element when the AN input is higher than the AP input;

a B differential switch pair having an SBP switch element controlled by the BP input and an SBN switch element controlled by the BN input, and the SBP and SBN switch elements are connected to a common TB current source providing an ITB current, wherein the ITB current flows through the SBP switch element when the BP input is higher than the BN input, and the ITB current flows through the SBN switch element when the BN input is higher than the BP input;

a first C differential switch pair having a first SCP switch element controlled by the CP input and a first SCN switch element controlled by the CN input, and the first SBP and the first SBN switch elements are connected to a common TC1 current source providing an ITC1 current, wherein the ITC1 current flows through the first SCP switch element when the CP input is higher than the CN input, and the ITC1 current flows through the first SCN switch element when the CN input is higher than the CP input;

a second C differential switch pair having a second SCP switch element controlled by the CP input and a second SCN switch element controlled by the CN input, and the second SBP and the second SBN switch elements are connected to a common TC2 current source providing an ITC2 current, wherein the ITC2 current flows through the second SCP switch element when the CP input is higher than the CN input, and the ITC2 current flows through the second SCN switch element when the CN input is higher than the CP input.

9. The circuit of claim 8, further comprising:

a first resistor connected to an upper power supply rail and to both the SAP and the first SCP switch elements so that the current through the first resistor is the sum of the currents through both the SAP and the first SCP switch elements;

a second resistor connected to the upper power supply rail and to both the SAN and the second SCP switch elements so that the current through the second resistor is the sum of the currents through both the SAN and the second SCP switch elements;

a third resistor connected to the upper power supply rail and to both the SBP and the first SCN switch elements so that the current through the third resistor is the sum of the currents through both the SBP and the first SCN switch elements;

a fourth resistor connected to the upper power supply rail and to both the SBN and the second SCN switch elements so that the current through the fourth resister is the sum of the currents through both the SBN and the second SCN switch elements.

10. The circuit of claim 9, further including a combining circuit comprising:
- an S1 switching element controlled by a first output voltage produced by current flowing through the first resistor;
- an S2 switching element controlled by a second output voltage produced by current flowing through the second resistor;
- an S3 switching element controlled by a third output voltage produced by current flowing through the third resistor;
- an S4 switching element controlled by a fourth output voltage produced by current flowing through the fourth resistor.

11. The circuit of claim 10, wherein each of the S1, S2, S3, and S4 switching elements are connected to an ITZ current source, the S1 and S3 switching elements are connected in parallel and both deliver current to an RZP resistor, and the S2 and S4 switching elements are connected in parallel and both deliver current to an RZN resistor, wherein a voltage produced by current flowing through the RZP resister is a ZP output, and a voltage produced by current flowing through the RZN resister is a ZN output, and the first, second, third, fourth, RZP, and RZN resistors are connected to one switch element between them and a current source which is connected to a lower power rail.

* * * * *